United States Patent
Fautz

(10) Patent No.: US 9,335,392 B2
(45) Date of Patent: May 10, 2016

(54) METHOD TO ACQUIRE A MAGNETIC RESONANCE IMAGE DATA SET OF A TARGET VOLUME

(75) Inventor: Hans-Peter Fautz, Forchheim (DE)

(73) Assignee: Siemens Aktiengesellschaft, Munich (DE)

( * ) Notice: Subject to any disclaimer, the term of this patent is extended or adjusted under 35 U.S.C. 154(b) by 929 days.

(21) Appl. No.: 13/571,639

(22) Filed: Aug. 10, 2012

(65) Prior Publication Data
US 2013/0038327 A1 Feb. 14, 2013

(30) Foreign Application Priority Data
Aug. 11, 2011 (DE) .......................... 10 2011 080 793

(51) Int. Cl.
*G01R 33/483* (2006.01)
*G01R 33/565* (2006.01)

(52) U.S. Cl.
CPC ........ *G01R 33/4833* (2013.01); *G01R 33/5659* (2013.01); *G01R 33/56563* (2013.01)

(58) Field of Classification Search
CPC ........... G01R 33/4833; G01R 33/5659; G01R 33/56563
See application file for complete search history.

(56) References Cited

U.S. PATENT DOCUMENTS

| | | | |
|---|---|---|---|
| 4,814,709 A | 3/1989 | Takeda et al. | |
| 5,051,698 A | 9/1991 | Ordidge | |
| 6,198,959 B1* | 3/2001 | Wang | 600/413 |
| 6,381,486 B1* | 4/2002 | Mistretta et al. | 600/420 |
| 6,556,856 B1* | 4/2003 | Mistretta et al. | 600/420 |
| 7,312,610 B2* | 12/2007 | Harder | 324/307 |
| 7,583,992 B2* | 9/2009 | Mistretta et al. | 600/420 |
| 7,602,179 B2* | 10/2009 | van der Kouwe et al. | 324/307 |
| 7,800,367 B2* | 9/2010 | Bhardwaj et al. | 324/309 |
| 8,155,419 B2* | 4/2012 | Haider et al. | 382/131 |
| 8,472,684 B1* | 6/2013 | Periaswamy | 382/128 |
| 8,599,215 B1* | 12/2013 | Boitano | 345/629 |
| 2007/0013374 A1 | 1/2007 | Griswold et al. | |
| 2008/0284431 A1 | 11/2008 | Fishkin | |
| 2011/0172515 A1 | 7/2011 | Fautz et al. | |

* cited by examiner

*Primary Examiner* — Dixomara Vargas
(74) *Attorney, Agent, or Firm* — Schiff Hardin LLP

(57) ABSTRACT

In a method to acquire a magnetic resonance image data set of a target volume with a magnetic resonance device, wherein the target volume is composed of a number of sub-volumes defined in a two-dimensional plane orthogonal to the readout direction, for each sub-volume, in order to acquire a partial data set of a sub-volume, a targeted excitation of the sub-volume and a data acquisition from that sub-volume to measure the partial data set take place by radiation of a first radio-frequency pulse acting in a first direction of the plane and radiation of a second radio-frequency pulse acting in a second direction that is orthogonal to the first direction. The partial data sets are combined into the magnetic resonance data set.

10 Claims, 4 Drawing Sheets

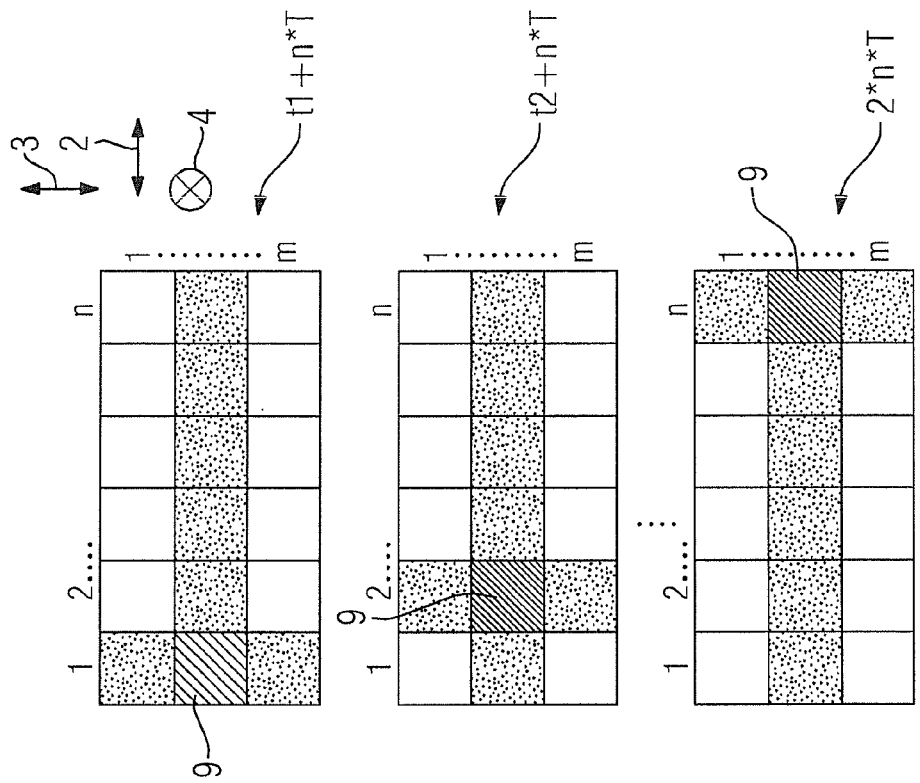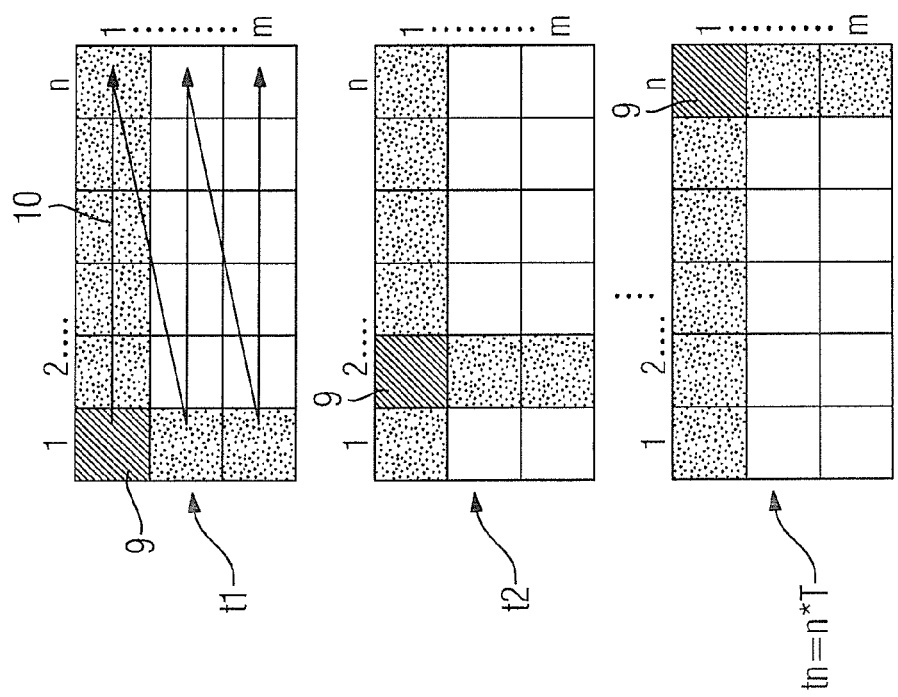

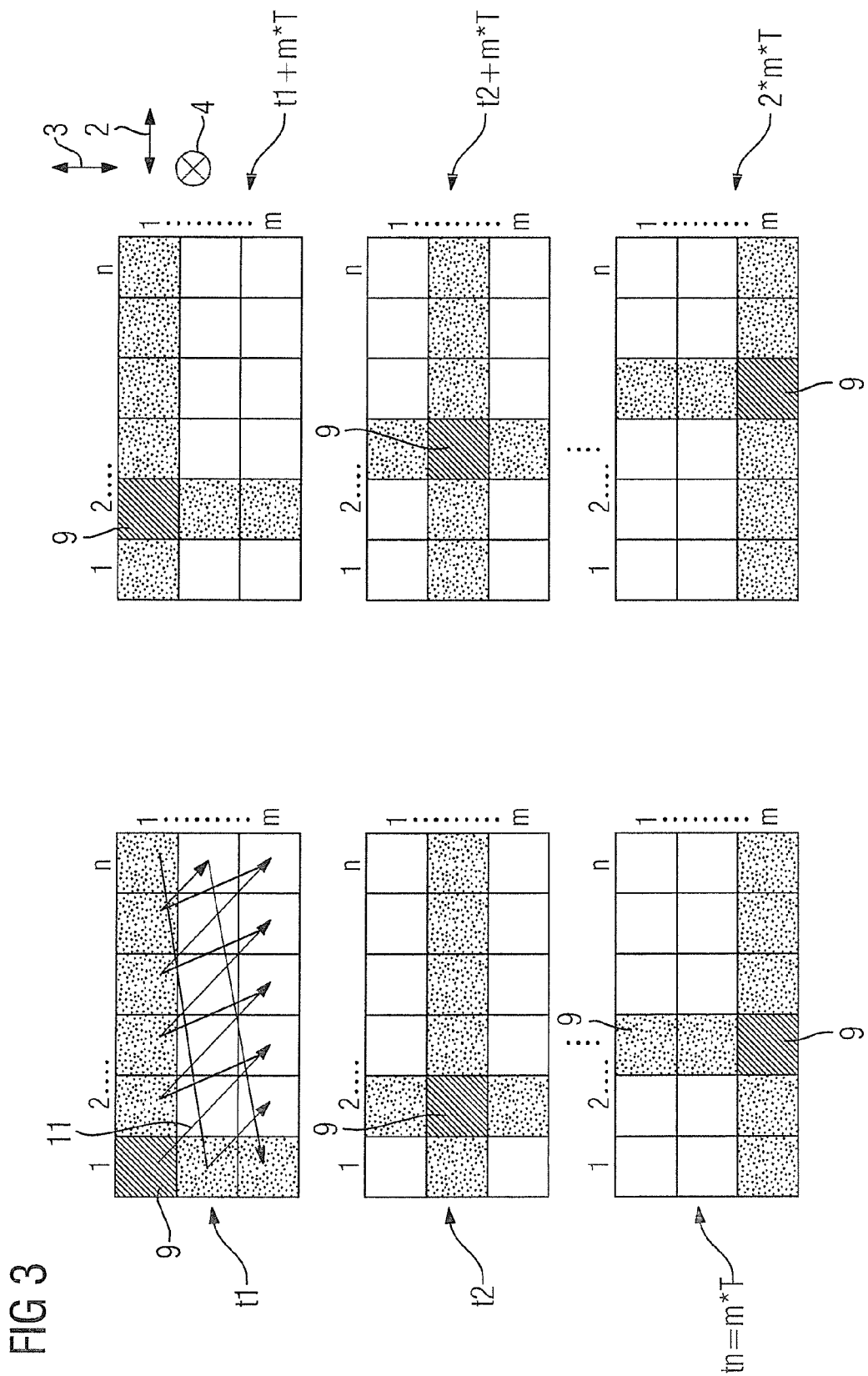

METHOD TO ACQUIRE A MAGNETIC RESONANCE IMAGE DATA SET OF A TARGET VOLUME

BACKGROUND OF THE INVENTION

1. Field of the Invention

The present invention concerns a method to acquire a magnetic resonance image data set of a target volume with a magnetic resonance device.

2. Description of the Prior Art

Multi-slice acquisitions that can cover a large target volume by means of parallel slices are a known concept in magnetic resonance imaging. A direction is consequently designated along which a division of the target volume into multiple slices (slice selection direction) takes place one-dimensionally using a slice thickness. It is known to acquire the slices with temporal interleaving, meaning that the entire target volume is acquired as a slice package in the same measurement time in which one slice can be acquired at a predetermined contrast. The measurement time in which a single acquisition (single shot) of a slice is possible is typically designated as the repetition time, after which this same slice can be acquired again (in particular in multi-shot acquisitions). In other words, the temporally interleaved acquisition means that signals are acquired from N non-overlapping slices in the time interval of an Nth part of the repetition time. In comparison to a volume excitation with the same acquisition efficiency (excitations per time unit), the contrast-determining repetition time is extended by a factor of N. The saturation of the spin system by the repeated excitations is significantly reduced.

In addition, the acquisition of target volumes as a whole is known. For example, if the spinal column should be acquired as a target volume, using two radio-frequency pulses of a spin echo-based sequence one can select not only slices in one dimension but also parallelograms in two dimensions, by rotating the slice selection direction in the spin echo sequence of the excitation pulse counter to that of the refocusing pulse. The spin echo signal that is generated in such a manner originates from the intersection of the two rotated slices that are respectively selected with the excitation pulse and the refocusing pulse. In this way it is possible (for example in the case of the spinal column) to acquire the target volume as a complete subject, in contrast to multi-slice acquisitions in which the individual slices form only sub-volumes of the target volume.

SUMMARY OF THE INVENTION

An object of the invention is to provide an acquisition method that allows a more flexible adaptation of acquisition parameters and evaluation parameters for partial regions of a target volume.

To achieve this object, in a method of the aforementioned type, according to the invention the target volume is composed of multiple sub-volumes defined in a two-dimensional plane situated orthogonally to the readout direction. For each sub-volume, to acquire a partial data set of a sub-volume, a targeted excitation of said sub-volume and a data acquisition from that sub-volume to detect the partial data set take place by means of a first radio-frequency pulse acting in a first direction of the plane and a second radio-frequency pulse acting in a second direction (that is orthogonal to the first direction), and the partial data sets are combined into the magnetic resonance data set.

According to the invention, two radio-frequency pulses acting in different directions (namely the first direction and the second direction) are used not only to acquire slices but also to be able to divide the sub-volumes to be acquired within these slices. For example, if an analogy of the multi-slice acquisition is considered, with the second radio-frequency pulse (that acts as selected in a different direction) it is thus possible to subdivide the one-dimensionally defined slices in an additional dimension (that is situated orthogonal to the initial direction) because the second radio-frequency pulse selects a different slice and only the intersection volume of the two slices is considered in the acquisition of the partial data set from the sub-volume. For example, a switching of gradients takes place to cause the radio-frequency pulses to act in different directions. The slice selection direction thus changes, for example in a time period between the two radio-frequency pulses.

The use of spin echo-based techniques (particularly a basic spin echo technique itself) to acquire the partial data sets is suited for the implementation of the method according to the invention. One of the radio-frequency pulses can be selected as an excitation pulse and the other radio-frequency pulse can be selected as a refocusing pulse. In spin echo techniques or spin echo-based techniques, two radio-frequency pulses are provided anyway that can consequently act in different directions and therefore enable a selection of sub-volumes in another dimension. In general, the areas defining the sub-volumes in the plane can be parallelograms (but preferably rectangles) that are arranged in the plane in rows and columns like a matrix.

Such a finer division of the target volume into sub-volumes can have significant advantages relative to the multi-slice decomposition because a greater flexibility is provided. Thus, initially, at least two sub-volumes are acquired in parallel. Given the use of sub-volumes as defined in the present invention, acquisitions of target volumes can be accelerated to a greater degree by means of parallel imaging than slices that are ultimately defined in one dimension.

Additionally, different shim settings optimized for the sub-volume are used for different sub-volumes. It is thus possible to determine and to use shim settings improved for each sub-volume, in particular improved with regard to the basic magnetic field (B0 field). This can be extended to shim settings for the B1 field. These can ultimately also be optimized separately for each sub-volume, and thus more precisely.

It is also advantageous for a movement-dependent position of at least a portion of the sub-volumes to be determined during their acquisition, with the combination of the partial data sets with the magnetic resonance image data set taking place dependent on the position. It often occurs—particularly in medical applications—that moving target volumes are to be acquired at least in part during the acquisition. In this case the selection of the sub-volumes can not only take place neatly so that moving and unmoving sub-volumes exist, but also the position of the sub-volumes is acquired, such that the partial image data sets can then be spatially shifted in combination (corresponding to the movement) and combined. Each sub-volume is consequently acquired consistently with regard to the movement, for example by single shot acquisitions for each sub-volume. The movement that can likewise be determined is then taken into account in order to generate the magnetic resonance image data set. Because each sub-volume is independently consistently acquired with regard to the movement, movement artifacts are markedly reduced.

In this context it is also noted that the sub-volumes can be selected so that the single shot exposures have a predetermined contrast, for example given three-dimensional turbo spin echo imaging (TSE imaging) with an arbitrarily selectable echo train length.

In a further embodiment of the present invention, that the areas in the plane that define the sub-volumes are arranged like a matrix with a first number of rows extending in the first direction and a second number of columns extending in the second direction. When the directions are orthogonal to one another, these areas are rectangles.

In a further embodiment of the invention, the sub-volumes are acquired sequentially row-by-row or column-by-column, with the direction of successive acquisitions initially progressing in the direction for which the radio-frequency pulse produce a lower saturation. In this way it is possible to acquire the partial data sets serially in a shorter period of time, particularly with regard to a temporally interleaved acquisition, by the order of the sub-volumes to be acquired being selected so that a reduced saturation of only one of the two radio-frequency pulses results because an overlap occurs only with regard to the two selected slices in successive excitations in which the lower signal attenuation occurs due to the saturation. It is thus possible to acquire T1-weighted spin echo images, for example, wherein a shorter repetition time is present. The excitation pulses (i.e., the first radio-frequency pulse) primarily contributes to the T1 weighting. The radio-frequency pulse (i.e., the second radio-frequency pulse) more strongly saturates. Consequently, progression initially takes place along the first direction (thus the rows). If a minimal repetition time of T (corresponding to the minimal time between two successive excitation pulses) results for the excitation pulse, for the same slice (in this case a row) the excitation pulse (here the first radio-frequency pulse) can always be repeated for the same slice after the time T. The refocusing pulse (thus the second radio-frequency pulse in the example) is repeated for this same slice (here column) only after a repetition time of n×T (if n is designated as the second number). In this way the saturation can be reduced overall with the repetition times relative to conventional spin echo imaging.

In another embodiment of the present invention, alternatively the acquisition of the sub-volumes sequentially takes place diagonally. In this case the acquisition order is such that, in the matrix, a sub-volume is always continued in columns and rows so that overall a diagonal progression results. A diagonally adjacent sub-volume is therefore achieved that is completely unaffected by the preceding radio-frequency pulses, which allows the sub-volumes to be selected spatially independently of one another, since the slices selected by the first and the second radio-frequency pulses do not overlap in successive excitations. Analogously, if the minimum repetition time between two successive radio-frequency pulses is designated with T, via the first radio-frequency pulse (the first number is designated with m) this same slice can only be re-selected after a time m×T, while for the second radio-frequency pulse (the second number is again designated with n), this same slice can be selected again only after a time n×T, given a suitable selection with regard to the diagonal. In this way saturation effects are markedly reduced so that in particular very short repetition times can be realized.

In a further embodiment of the method according to the invention, multiple shots are acquired for each sub-volume, with the acquisition of multiple (in particular all) sub-volumes taking place in the sub-volume repetition time for a defined sub-volume. This means that the partial data set results from multiple acquisitions of the corresponding sub-volume that take place in an interval of a sub-volume repetition time. The acquisition of all sub-volumes can now take place with temporal interleaving, which means that the sub-volume repetition time is used to respectively acquire the other sub-volumes with a time offset. It is thus possible to cover a target volume by three-dimensional sub-volumes that are acquired with temporal interleaving wherein, as noted above, the selection of the various sub-volumes can be made entirely or partially spatially independently. When progression is made diagonally, for example, as noted above, in order to not acquire the same slices in successive acquisitions, the saturation is strongly reduced and short repetition times or generally shortened acquisition times can be realized.

BRIEF DESCRIPTION OF THE DRAWINGS

FIG. 2 shows acquisition sequences (orders) in a first embodiment of the method according to the invention.

FIG. 3 shows acquisition orders of a second embodiment of the method according to the invention.

DESCRIPTION OF THE PREFERRED EMBODIMENTS

The exemplary embodiments of the method according to the invention that are shown here pertain to the acquisition of a target volume in a magnetic resonance image data set with a magnetic resonance device that is designed to implement the method according to the invention. Ultimately, multiple slices defined in a direction across the slice thickness should not thereby be read out (as is known); rather sub-volumes should be read out that are defined by an overlapping of slices. For this purpose, two radio-frequency pulses are used for excitation that act in orthogonal directions, namely a first direction and a second direction. In the present exemplary embodiments, a spin echo technique is used in which the first radio-frequency pulse is the excitation pulse and the second radio-frequency pulse is the refocusing pulse.

An excitation in a first slice along the first direction is consequently generated by the excitation pulse while a refocusing of the spins in a second slice that extends along the second direction takes place via the refocusing pulse. The spin echo signal that can then be measured originates from the overlap of the two slices orthogonal to one another (the sub-volume). In order to modify the active direction of the radio-frequency pulses, in the embodiment shown here a switching of gradients is provided, which means that the slice selection direction is rotated by 90°.

Figure 1:
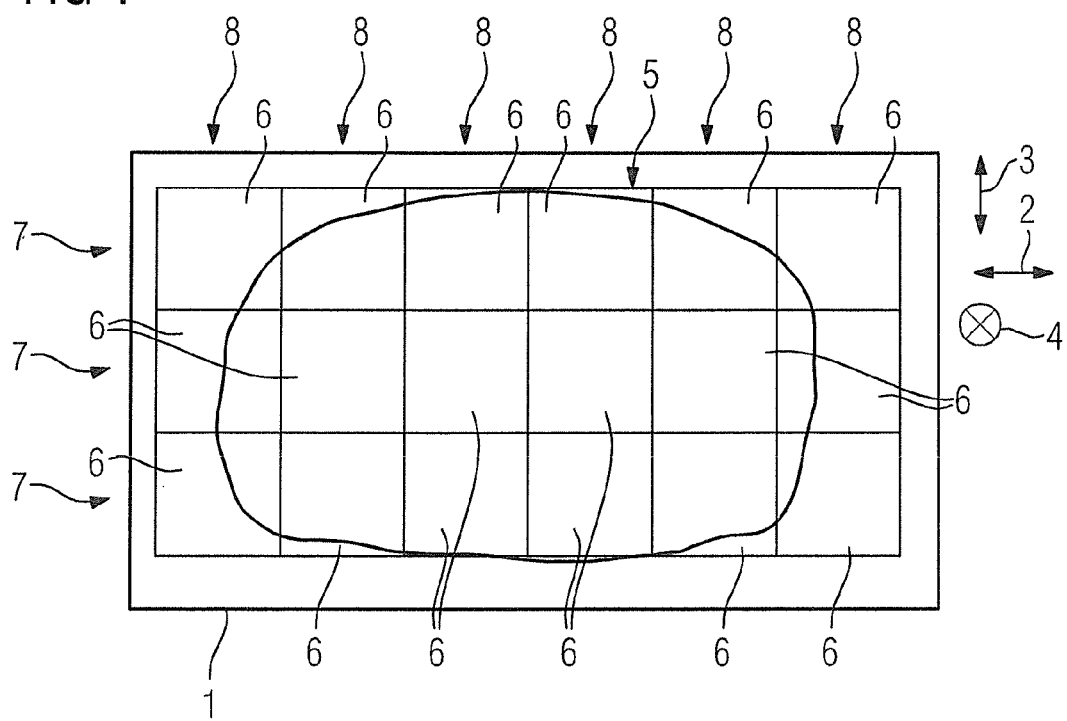
FIG. 1 illustrates the basic geometry in the method according to the invention.

FIG. 1 more specifically shows the geometry in the exemplary embodiments of the method according to the invention that are described here in detail. The plane 1 is shown that is spanned by the first direction (arrow 2) and the second direction (arrow 3). The two directions thus ultimately correspond to phase coding directions and are orthogonal to the readout direction (readout), marked by the arrow 4.

The intersection area 5 of the target volume with the plane 1 is clearly divided into partial areas 6 that, together with the extent of the target volume in the readout direction, define the sub-volumes that should be individually acquired in partial image data sets. The rectangular partial areas 6 are consequently arranged like a matrix, and in fact in rows 7 and columns 8. In general, a first number m of rows 7 and a second number n of columns 8 are thereby provided.

It should now be provided to acquire the individual partial data sets (and thus the total target volume) in an optimally short period of time, wherein given single shot acquisitions of the sub-volumes the acquisition of the individual partial data sets should take place as close to one another in time as is possible, while given multi-shot acquisitions (consequently the repeated excitation and measurement of the sub-volumes) a temporally interleaved acquisition of the partial data sets should take place, which is presented in detail in the following. An optimization with regard to the acquisition time thus should be made such that an overly high saturation does not occur and such that the desired contrast is achieved for the magnetic resonance image data set that is later composed from the partial data sets.

FIG. 2 explains in detail a first exemplary embodiment of the method according to the invention. The sub-volumes to be acquired (represented by the partial area 9 shown in hatched lines) at different points in time t1, t2, . . . and the excited slices (partial areas shown in dots) are thereby indicated for the shown points in time using six presented individual images.

As indicated by the arrows 10, this first exemplary embodiment proceeds row by row. This means that the sub-volumes of one row 7 are initially acquired in succession, after which the process jumps to the next row 7.

This thus means that the repetition time for the first radio-frequency pulse (here the excitation pulse)—meaning the time after which the same slice (here the same row 7) is excited by the first radio-frequency pulse—is the interval between two measurements in the sub-volumes, which should be designated in the following as a time T. The time T thus corresponds to the minimum time between two successive excitation pulses. As is to be learned from the point in time to and the point in time t1+n×T and is apparent from the partial images shown opposite one another to the left and right in FIG. 2, n×T accordingly results for the repetition time of the second radio-frequency pulse (here the refocusing pulse), which means that the same slice (here column 8) is refocused again with the refocusing pulse after a time of n×T.

This selected order is grounded in that the saturation effect is stronger for the refocusing pulse so that this should be applied less often to the same slice, and consequently the saturation should be reduced. For example, given such a procedure T1-weighted spin echo images can be acquired that have a short repetition time. The excitation pulses (thus here the first radio-frequency pulse) primarily contribute to the T1 weighting, such that the saturation therefore can be markedly reduced relative to the conventional spin echo imaging, which also applies to the repetition times.

FIG. 3 shows another embodiment of the method according to the invention that is even further optimized with regard to the saturation. Various partial images for various points in time t1, t2, . . . are shown again. The sub-volume to be acquired at any point in time is again explained via the partial area 9 that is shown with hatched lines. As the arrows 11 show, however, here progress occurs in diagonals, which means that the sub-volume in the second column and the second line etc. is acquired at the second point in time t2. Different slices are therefore always excited in successive acquisition of partial data sets, such that repetition times for the radio-frequency pulses (i.e. times in which the same slice is excited via a radio-frequency pulse) can be achieved that sufficiently account for saturation and contrast, wherein nevertheless sequences can be started one after another at a short time interval T in sub-volumes. In particular, a parallel imaging is also conceivable as long as independent slices are excited.

In the case according to FIG. 3, if T again designates the time between two successive acquisitions in sub-volumes a repetition time of the first radio-frequency pulse (after which this same slice is exited again) of m×T thus results; for the second radio-frequency pulse a repetition time of (m−1)×T results, wherein given a different selection of the diagonals (in the shown example continuation of the second diagonal in the first row and the (m+1) column) a repetition time—after which the same slice is applied [sic] via the second radio-frequency pulse—of n×T can be achieved for the second radio-frequency pulse.

In order to now realize an optimal acquisition time that is shortened relative to known spin echo acquisitions, the parameters T, n and/or m can be selected so that they are chosen optimally as a rule with regard to the saturation effect of the radio-frequency pulses and of the desired contrast. An optimization method can thus be used in order to achieve optimally short acquisition times in that the parameters m, n and T are optimized with regard to a sufficiently low saturation and a sufficiently high contrast.

Figure 4:
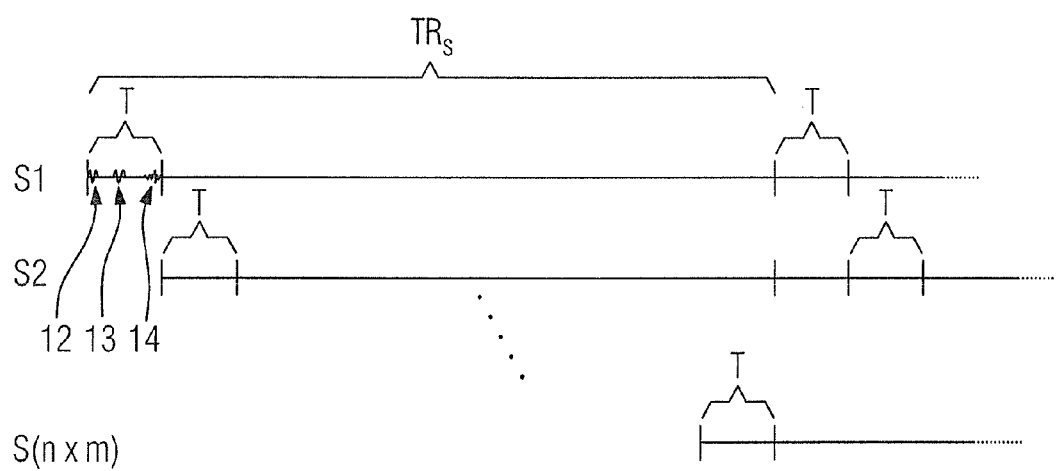
FIG. 4 is a flowchart for a temporally interleaved acquisition of the sub-volumes in accordance with the invention.

As noted, it is possible to acquire partial data sets of the sub-volumes via measurement of the signals after multiple, temporally separated excitation (i.e. in multiple "shots"). It is then conceivable to acquire the sub-volumes to shorten the acquisition times with temporal interleaving, as this is schematically shown in FIG. 4.

If n×m sub-volumes are present, a sub-volume repetition time $TR_S$ is defined that corresponds to (n×m) times the acquisition time T of a sequence for a sub-volume which—as is shown for the first shot of the first sub-volume S1—includes the excitation pulse 12, the refocusing pulse 13 and the reception of the echo signal 14. Immediately following this is then the acquisition of data for the second sub-volume S2 up to the sub-volume S(n×m). The next shot then begins again with the first sub-volume S1.

It should be noted that individual shot acquisitions and the acquisition time T can also be selected so that the respective partial data set is movement-consistent. This is advantageous when an (at least partially) moving target volume is present, wherein then a movement-dependent position of at least a portion of (in particular all) sub-volumes is determined during their acquisition. The shifts occurring via the movement between the acquisition of the individual sub-volumes can then be corrected again given the combination of the partial data sets into the magnetic resonance data set via corresponding shift of the partial data sets, such that movement artifacts are minimized overall. Moreover, the sub-volumes can be selected so that the single shot exposures have a predetermined contrast, for example by use of the three-dimensional turbo spin echo imaging with arbitrarily selectable echo train length.

In general, in the exemplary embodiments presented herein, at least two sub-volumes are acquired in parallel. Acquisitions of three-dimensional volumes can be markedly better accelerated by means of parallel imaging than acquisitions of two-dimensional slices given a multi-slice acquisition.

It is furthermore appropriate for improved shim settings with regard to the B0 shim and B1 shim to be determined and applied for each sub-volume, such that inhomogeneities for each sub-volume can be corrected individually (and thus in an improved manner).

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to acquire a magnetic resonance image data set of a target volume of an examination subject, comprising:

through a computerized controller of a magnetic resonance data acquisition unit, defining a readout direction for acquiring magnetic resonance data from a target volume of an examination subject, and dividing said target volume into a plurality of sub-volumes in a two-dimensional plane that is orthogonal to said readout direction;

from said computerized controller, operating said magnetic resonance data acquisition unit to acquire, from each sub-volume, a partial data set by targeted excitation of the respective sub-volume by radiating a first radio-frequency pulse effective in a first direction of said plane and radiating a second radio-frequency pulse effective in a second direction that is orthogonal to said first direction, and detecting magnetic resonance data from the respective sub-volume, in said readout direction, resulting from the targeted excitation of the respective sub-volume; and in a processor, combining the respective partial data sets acquired from the respective sub-volumes to produce a magnetic resonance data set of said target volume, and making said magnetic resonance data set available from said processor in a data file.

2. A method as claimed in claim 1 comprising, from said computerized controller, operating said magnetic resonance data acquisition unit to activate respective gradients that cause said first and second radio-frequency pulses to be respectively effective in said first and second directions.

3. A method as claimed in claim 1 comprising, from said computerized controller, operating said magnetic resonance data acquisition unit to acquire the respective partial data sets from the respective sub-volumes in a spin echo-based sequence wherein one of said first and second radio-frequency pulses is an excitation pulse and the other of said first and second radio-frequency pulses is a refocusing pulse.

4. A method as claimed in claim 1 comprising, through said computerized controller, defining respective partial areas of said target volume that correspond to sub-volumes in a matrix in said plane, with a first number of rows proceeding in said first direction and a second number of columns proceeding in said second direction.

5. A method as claimed in claim 4 comprising, from said computerized controller, operating said magnetic resonance data acquisition unit to acquire the respective partial data sets from the respective sub-volumes sequentially in said rows and said columns, progressing initially along a direction, among said first direction and said second direction, for which the associated first or second radio-frequency pulse produces a lower saturation.

6. A method as claimed in claim 4 comprising, from said computerized controller, operating said magnetic resonance data acquisition unit to acquire the respective partial data sets from the respective sub-volumes diagonally in said matrix.

7. A method as claimed in claim 1 comprising, from said computerized controller, operating said magnetic resonance data acquisition unit in multiple shots respectively for the sub-volumes with acquisition of the partial data set from the respective sub-volume occurring completely within the respective shots.

8. A method as claimed in claim 1 comprising, from said computerized controller, acquiring respective partial data sets from at least two of said sub-volumes in parallel.

9. A method as claimed in claim 1 comprising, from said computerized controller, operating said magnetic resonance data acquisition unit with respectively different shim settings during the respective acquisitions of the respective partial data sets for the respective sub-volumes, with each shim setting being optimized for the respective sub-volume.

10. A method as claimed in claim 1 wherein said target volume exhibits movement, and comprising, from said computerized controller, operating said magnetic resonance data acquisition unit to identify a movement-dependent position of at least some of said sub-volumes during acquisition of respective partial data sets therefrom, and, in said processor, combining said partial data sets dependent on the respective movement-dependent positions.

\* \* \* \* \*